United States Patent [19]
Mehr

[11] Patent Number: 6,133,134
[45] Date of Patent: Oct. 17, 2000

[54] BALL GRID ARRAY INTEGRATED CIRCUIT PACKAGE

[75] Inventor: Behrooz Mehr, Palo Alto, Calif.

[73] Assignee: Intel Corporation, Santa Clara, Calif.

[21] Appl. No.: 08/982,490

[22] Filed: Dec. 2, 1997

[51] Int. Cl.[7] .............................. H01L 21/44; H01L 23/49
[52] U.S. Cl. ......................... 438/612; 438/613; 257/773; 361/772
[58] Field of Search ...................... 438/612, 613, 438/667; 257/773, 774; 361/772, 774, 777

[56] References Cited

U.S. PATENT DOCUMENTS

| | | | |
|---|---|---|---|
| 5,216,278 | 6/1993 | Lin et al. | 257/774 |
| 5,706,178 | 1/1998 | Barrow | 361/777 |
| 5,759,910 | 6/1998 | Mangold et al. | 439/613 |
| 5,875,102 | 2/1999 | Barrow | 438/612 |

*Primary Examiner*—Kevin M. Picardat
*Attorney, Agent, or Firm*—Blakely, Sokoloff, Taylor & Zafman LLP

[57] ABSTRACT

A ball grid array integrated circuit package which has a plurality of elliptical shaped solder pads located on a substrate of the package. Routing traces are connected to the apexes of the elliptical shaped solder pads. Connecting a routing trace to the apex of an elliptical shaped solder pad reduces the stress points on the trace/pad interface. Vias may be coupled to the solder pads and the routing traces. The vias are located at the apexes of the elliptical shaped solder pads to reduce the stress points of the substrate.

11 Claims, 1 Drawing Sheet

BALL GRID ARRAY INTEGRATED CIRCUIT PACKAGE

BACKGROUND OF THE INVENTION

1. Field of the Invention

The present invention relates to a ball grid array (BGA) integrated circuit package.

2. Description of Related Art

Integrated circuits are typically assembled to a package that is mounted to a printed circuit board. There are many types of integrated circuit packages such as pin grid array (PGA), land grid array (LGA) and ball grid array (BGA). BGA packages contain a plurality of solder balls that are attached to corresponding solder pads located on an external bottom surface of the package. The package is mounted to a printed circuit board and the solder balls are reflowed to attach the package to the board.

FIG. 1 shows a solder pad layout for a BGA package of the prior art. The package includes a number of solder pads 1 located on a bottom surface of a package substrate 2. A number of routing traces 3 may also extend across the bottom surface. The routing traces 3 and portions of the solder pads 1 may be covered with a solder mask 4. The solder mask 4 has openings 5 that exposes contact areas 6 of the solder pads 1. Solder balls (not shown) are attached to the exposed contact areas 6 of the solder pads 1. The solder balls are used to mount the package to a printed circuit board. The solder mask 4 controls the diameter of the attached solder balls and prevents electrical shorts in the package.

Some of the routing traces 3 are connected to the solder pads 1. The solder pads 1 may also be connected to vias 7 that extend through the substrate 2 of the package. The circular shape of the solder pads 1 create stress points 8 at the intersection of the trace 3 and the pad 1. Stress points are also created at the intersections of the via 7, the trace 3 and the solder pad 1. Thermal cycling of the package may induce cracking at the stress points 8 of the substrate 2. Cracks may create an open circuit in the package. It would be desirable to provide a BGA package which has a more robust interconnect between the solder pads, routing traces and vias of the package.

SUMMARY OF THE INVENTION

The present invention is a ball grid array integrated circuit package which has a plurality of elliptical shaped solder pads located on a substrate of the package. Routing traces are connected to the apexes of the elliptical shaped solder pads.

DETAILED DESCRIPTION OF THE INVENTION

Figure 1:
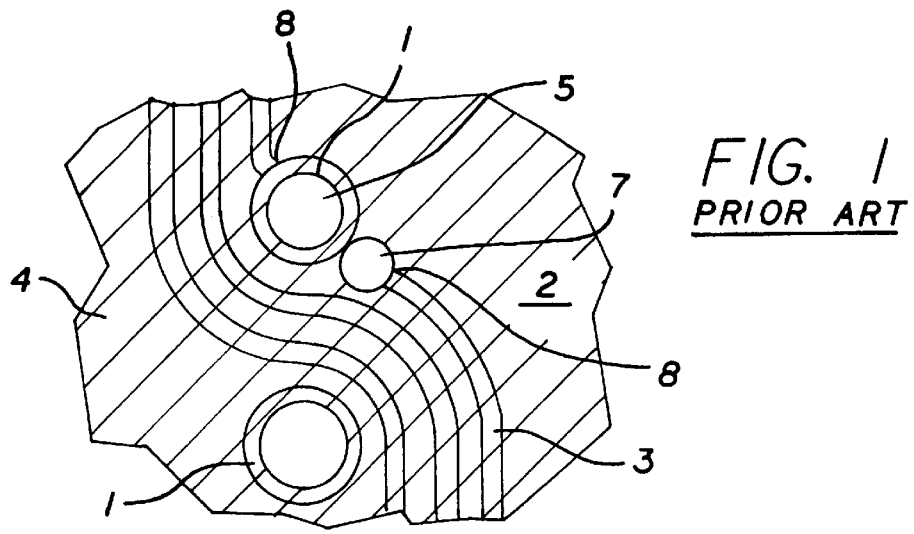
FIG. 1 is a bottom view of a ball grid array integrated circuit package of the prior art.
Figure 2:
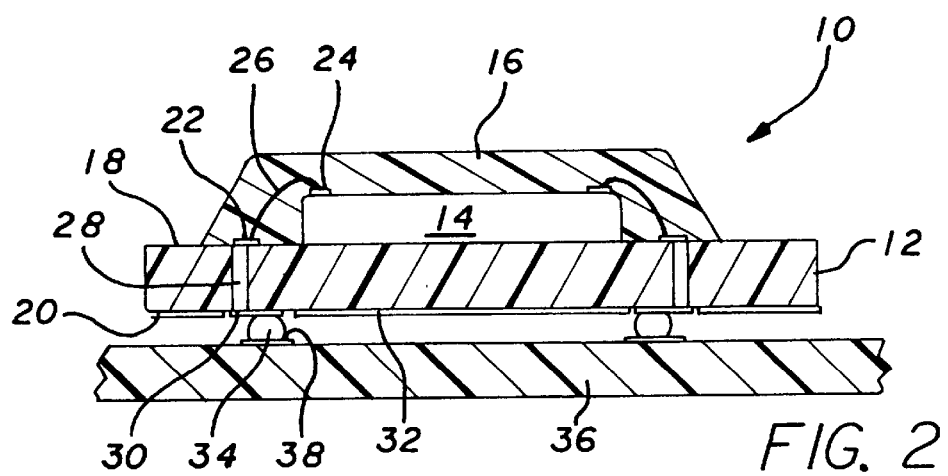
FIG. 2 is a cross-sectional view of a ball grid array integrated circuit package of the present invention.

Referring to the drawings more particularly by reference numbers, FIG. 2 shows a ball grid array (BGA) integrated circuit package 10 of the present invention. The package 10 includes a substrate 12 that supports an integrated circuit 14. The integrated circuit 14 may be a microprocessor, although it is to be understood that the circuit 14 may be any electrical device. The integrated circuit 14 is typically enclosed with an encapsulant 16 or a lid.

The substrate 12 has a top surface 18 and an opposite bottom surface 20. The top surface 18 has a plurality of contact pads 22 that are connected to corresponding bond pads 24 of the integrated circuit 14 by bond wires 26. Extending through the substrate 12 are a plurality of vias 28 which connect the contact pads 22 to a number of solder pads 30 located on the bottom surface 20. Portions of the bottom surface 20 are typically covered with a solder mask 32. The substrate 12, contact pads 22, vias 28 and solder pads 30 may be constructed with known photolithographic processes typically used to construct a printed circuit board. The solder mask 32 may be applied with known screening processes.

Solder balls 34 are attached to the solder pads 30 by a reflow process. The package 10 is attached to a printed circuit board 36 by placing the solder balls 34 onto corresponding surface pads 38 of the circuit board 36 and then reflowing the balls 34.

Figure 3:
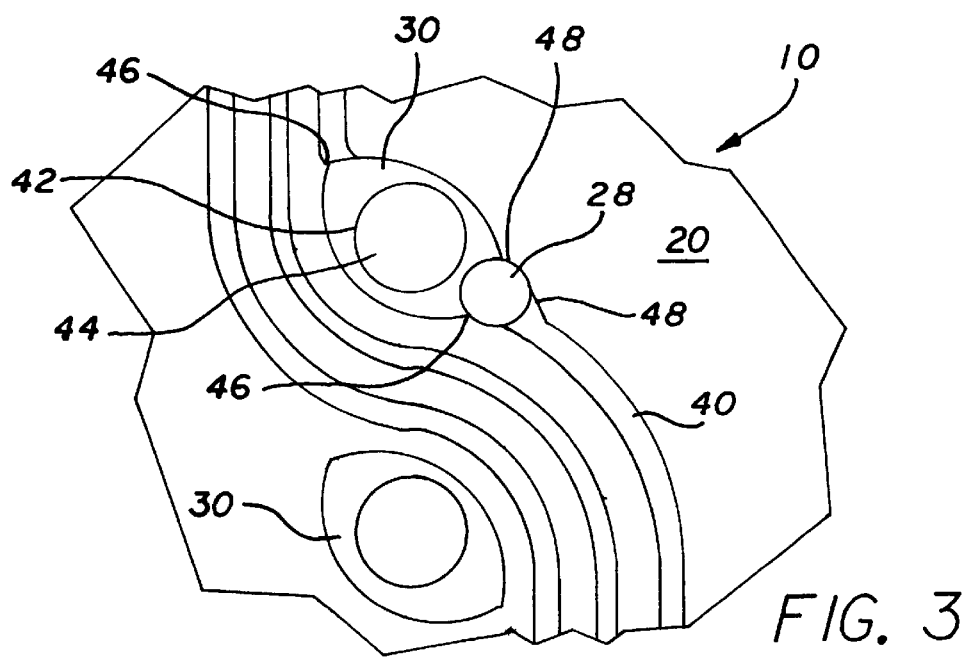
FIG. 3 is a bottom view of a substrate of the ball grid array integrated circuit package.

As shown in FIG. 3, the package 10 has a plurality of elliptical shaped solder pads 30 and a number of routing traces 40 that extend across the bottom surface 20 of the substrate 12. Some of the routing traces 40 are connected to the solder pads 30. Additionally, some of the solder pads 30 are also coupled to the vias 28 of the substrate 12. The solder mask 32 covers the traces 40 and portions of the solder pads 30. The solder mask 32 has openings 42 which expose a contact area 44 of each solder pad 30. The solder balls 34 are attached to the contact areas 44 of the solder pads 30.

The routing traces 40 are connected to the apexes 46 of the elliptical shaped solder pads 30. Attaching the traces 40 to the apex of an elliptical shaped pad 30 reduces the stress points at the trace/pad interface. Additionally, the elliptical shaped solder pads 30 provide additional adhesion strength for the pads 30, without reducing the line width of the routing traces 40, or the dielectric spacing between the traces 40.

The vias 28 are preferably located at the apexes 46 of the elliptically shaped solder pads 30. Relief strips 48 may be formed in the substrate 12 to eliminate stress points between the via 28 and the solder pad 30, and the via 28 and the routing trace 40.

To assemble a package 10, the substrate 12 is constructed with the contact pads, 22, vias 28, solder pads 30 and routing traces 40 formed therein. The solder mask 32 is then applied to the bottom surface 20 so that the contact areas 44 are exposed. The integrated circuit 14 is mounted and wire bonded to the substrate 12. The integrated circuit 14 is typically enclosed by the encapsulant 16.

Solder balls 34 are attached to the solder pads 30. The solder mask 32 controls the diameter and thus the height of the solder balls 34. The solder mask 32 also prevents electrical shorts on the bottom surface of the substrate 12. The substrate 12 is placed onto the printed circuit board 36, and the solder balls 34 are reflowed to attach the package 10 to the circuit board 36.

What is claimed is:

1. A method for attaching a solder ball to an integrated circuit package, comprising:
   a) providing a substrate which has an elliptical shaped solder pad that has an apex, and a routing trace that is attached to said apex of said elliptical shaped solder pad; and,
   b) attaching a solder ball to said elliptical shaped solder pad.

2. The method as recited in claim 1, further comprising applying a solder mask to said substrate before attaching said solder ball to said elliptical shaped solder pad wherein said solder mask has an opening that exposes a contact area of said elliptical shaped solder pad.

3. A ball grid array integrated circuit package, comprising:
   a substrate which has an elliptical shaped solder pad that has an apex, and a routing trace that is attached to said apex of said elliptical shaped solder pad.

4. The package as recited in claim 1, further comprising a via that is coupled to said elliptical shaped solder pad.

5. The package as recited in claim 4, wherein said via is located at an apex of said elliptical shaped solder pad.

6. The package as recited in claim 1, further comprising a solder mask that covers said routing trace and a portion of said elliptical shaped solder pad to expose a ball contact area.

7. A ball grid array integrated circuit package, comprising:
   a substrate which has a first elliptical shaped solder pad that has an apex, a second solder pad, a first routing trace that is attached to said apex of said first elliptical shaped solder pad, and a second routing trace that is located between said first elliptical shaped solder pad and said second solder pad.

8. The package as recited in claim 7, further comprising a via that is coupled to said first elliptical shaped solder pad.

9. The package as recited in claim 8, wherein said via is located at said apex of said first elliptical shaped solder pad.

10. The package as recited in claim 7, further comprising a solder mask that covers said first and second routing traces and portions of said first elliptical shaped solder pad and said second solder pad, wherein said solder mask has a pair of openings to expose a first contact area of said first elliptical shaped solder pad and a second contact area of said second solder pad.

11. The package as recited in claim 7, wherein said second solder pad has an elliptical shape.

\* \* \* \* \*